US006261508B1

(12) United States Patent
Featherby et al.

(10) Patent No.: US 6,261,508 B1
(45) Date of Patent: Jul. 17, 2001

(54) METHOD FOR MAKING A SHIELDING COMPOSITION

(75) Inventors: Michael Featherby, San Diego; David J. Strobel, Poway; Phillip J. Layton; Edward Li, both of San Diego, all of CA (US)

(73) Assignee: Maxwell Electronic Components Group, Inc., San Diego, CA (US)

( * ) Notice: Subject to any disclaimer, the term of this patent is extended or adjusted under 35 U.S.C. 154(b) by 0 days.

(21) Appl. No.: 09/375,881

(22) Filed: Aug. 17, 1999

Related U.S. Application Data

(63) Continuation of application No. 08/791,256, filed on Jan. 30, 1997, which is a continuation-in-part of application No. 08/221,506, filed on Apr. 1, 1994, now abandoned.
(60) Provisional application No. 60/021,354, filed on Jul. 8, 1996.

(51) Int. Cl.[7] ............................. B29C 70/60; B29C 70/70
(52) U.S. Cl. ................... 264/408; 264/105; 264/272.17; 264/328.18
(58) Field of Search .................................. 264/406, 408, 264/104, 105, 134, 328.17, 328.18, 272.11, 272.17; 174/35 MS, 35 R (56) References Cited

U.S. PATENT DOCUMENTS

| 3,706,840 | 12/1972 | Moyle et al. ..................... 174/52 PE |
| 3,771,025 | 11/1973 | Berner ............................. 317/234 R |
| 3,828,425 | 8/1974 | Manus .................................. 29/590 |
| 3,914,858 | 10/1975 | Sonoda et al. ...................... 29/588 |
| 4,089,575 | 5/1978 | Grabbe ................................. 339/17 |
| 4,091,407 | 5/1978 | Williams et al. ..................... 357/54 |

(List continued on next page.)

FOREIGN PATENT DOCUMENTS

| 0160327 | 11/1985 | (EP) | .................................. 250/515.1 |
| 2584863 | 1/1987 | (FR) | . |
| 54-004781 | 7/1980 | (JP) | . |
| 56-103452 | 8/1981 | (JP) | ..................................... 257/660 |
| 57-095650 | 6/1982 | (JP) | . |

(List continued on next page.)

OTHER PUBLICATIONS

"Electronics Packaging and Production", pp. 26–27.
"Electronic materials and Processes, Consulting and Short Courses", pp. 1–3.
"Electronic Materials Handbook", pp. 470–483.
"Electronic Packaging and Interconnection Handbook", pp.6.41–6.49.
M.P. Baze et al., "Latch–Up Paths in Bipolar Integrated Circuits", IEEE Transactions on Nuclear Science, Dec. 1986, vol. NS–33. No. 6.
A. H. Johnston, et al., "The Effect of Temperature on Single–Particle Latch–Up", IEEE Transactions on Nuclear Science, Dec. 1991, vol. 38, No. 6.
Song et al., "Parametric Investigation of Latch–Up Sensitivity in 1.25 μm CMOS Technology", IEEE Transactions on Nuclear Science, Dec. 1987, vol. NS–43 No. 6.

*Primary Examiner*—Angela Ortiz
(74) *Attorney, Agent, or Firm*—Fitch, Even, Tabin & Flannery (57) ABSTRACT

The radiation shielding composition and method of the present invention relate to a conformal coating material composed of a matrix of densely packed radiation shielding particles, which are disbursed within a binder. The shielding composition is applied to objects to be protected such as integrated circuits, or to packages therefor, as well as for protecting animals including humans from unwanted exposure to radiation in outer space or other environments.

24 Claims, 7 Drawing Sheets

U.S. PATENT DOCUMENTS

| | | | |
|---|---|---|---|
| 4,100,675 | 7/1978 | Landsittel | 29/627 |
| 4,173,683 | 11/1979 | Comizzoli | 428/447 |
| 4,250,347 | 2/1981 | Fierkens | 174/52 |
| 4,468,411 | 8/1984 | Sloan et al. | 427/8 |
| 4,506,108 | 3/1985 | Kersch et al. | 174/52 |
| 4,633,573 | 1/1987 | Scherer | 29/589 |
| 4,652,465 | 3/1987 | Koto | 427/216 |
| 4,661,837 | 4/1987 | Sono | 357/84 |
| 4,663,240 | 5/1987 | Hajdu et al. | 428/545 |
| 4,687,622 | 8/1987 | Longden | 376/254 |
| 4,769,344 | 9/1988 | Sakai et al. | 437/216 |
| 4,833,334 | 5/1989 | Valy et al. | 250/515.1 |
| 4,835,120 | 5/1989 | Mallik et al. | 437/209 |
| 4,837,448 | 6/1989 | Banchelin et al. | 250/519.1 |
| 4,839,716 | 6/1989 | Butt | 357/74 |
| 4,888,449 | 12/1989 | Crane et al. | 174/52.4 |
| 4,891,687 | 1/1990 | Mallik et al. | 357/70 |
| 4,935,174 * | 6/1990 | Suzuki | 264/24 |
| 4,953,002 | 8/1990 | Nelson et al. | 357/74 |
| 4,967,315 | 10/1990 | Schelhorn | 361/424 |
| 4,975,762 | 12/1990 | Stradley et al. | 257/660 |
| 4,979,019 | 12/1990 | Paquette et al. | 257/690 |
| 5,047,260 * | 9/1991 | Durand | 427/54.1 |
| 5,096,851 | 3/1992 | Yamazaki et al. | 437/205 |
| 5,138,430 | 8/1992 | Gow, III et al. | 357/70 |
| 5,139,969 | 8/1992 | Mori | 437/183 |
| 5,149,662 | 9/1992 | Eichelberger | 437/8 |
| 5,151,770 | 9/1992 | Inoue | 357/53 |
| 5,166,772 | 11/1992 | Soldner et al. | 257/659 |
| 5,180,513 * | 1/1993 | Durand | 252/62.55 |
| 5,202,536 | 4/1993 | Buonanno | 174/35 GC |
| 5,206,794 | 4/1993 | Long | 257/675 |
| 5,239,126 | 8/1993 | Oshiba | 174/35 |
| 5,250,845 | 10/1993 | Runyan | 257/729 |
| 5,268,331 | 12/1993 | Abbott | 437/225 |
| 5,294,826 | 3/1994 | Marcantonio et al. | 257/659 |
| 5,304,750 | 4/1994 | Schubert et al. | 181/294 |
| 5,317,107 | 5/1994 | Osorio | 174/52.4 |
| 5,384,477 | 1/1995 | Bulucea et al. | 257/372 |
| 5,406,117 | 4/1995 | Dlugoecki et al. | 257/659 |
| 5,424,251 * | 6/1995 | Sono et al. | 264/272.17 |
| 5,441,900 | 8/1995 | Bulucea et al. | 437/24 |
| 5,527,742 | 6/1996 | Weiler et al. | 437/211 |
| 5,552,338 | 9/1996 | Kang | 437/170 |
| 5,561,265 | 10/1996 | Livshits et al. | 174/35 GC |
| 5,577,319 * | 11/1996 | Knecht | 264/272.17 |
| 5,589,129 * | 12/1996 | Kato et al. | 264/272.17 |
| 5,610,443 * | 3/1997 | Inagaki et al. | 257/788 |
| 5,672,918 | 9/1997 | Kimbrough et al. | 307/126 |
| 5,714,102 * | 2/1998 | Highum et al. | 264/105 |
| 5,770,304 | 6/1998 | Nakamura | 428/328 |
| 5,780,163 | 7/1998 | Camilletti et al. | 428/446 |
| 5,824,568 | 10/1998 | Zechman | 438/112 |
| 5,825,042 | 10/1998 | Strobel et al. | 250/515.1 |
| 5,851,852 | 12/1998 | Ostop et al. | 438/106 |
| 5,864,088 * | 1/1999 | Sato et al. | 174/35 MS |
| 5,880,403 | 3/1999 | Czajkowski et al. | 174/35 R |
| 5,888,850 | 3/1999 | Havens et al. | 438/127 |
| 5,889,316 | 3/1999 | Strobel et al. | 257/659 |

FOREIGN PATENT DOCUMENTS

| | | | |
|---|---|---|---|
| 60-106150 | 6/1985 | (JP) . | |
| 60-124834 | 7/1985 | (JP) . | |
| 60-180150 | 9/1985 | (JP) | 257/660 |
| 61-004249 | 1/1986 | (JP) | 257/659 |
| 61-004250 | 1/1986 | (JP) . | |
| 62-125651 | 6/1987 | (JP) | 257/660 |
| 2237053 | 9/1990 | (JP) | 257/659 |
| 2278740 | 11/1990 | (JP) . | |
| 4094560 | 3/1992 | (JP) | 257/660 |
| 4273200 | 9/1992 | (JP) . | |

* cited by examiner

METHOD FOR MAKING A SHIELDING COMPOSITION

CROSS-REFERENCE TO RELATED APPLICATIONS

This application is a continuation of U.S. Ser. No. 08/791,256, for "METHODS AND COMPOSITIONS FOR IONIZING RADIATION SHIELDING," FILED Jan. 30, 1997, of Featherby et al, which is a continuation of U.S. Provisional Application No. 60/021,354, filed Jul. 8, 1996, both of which are incorporated herein by reference.

This application is a continuation of U.S. Ser. No. 08/791,256, filed Jan. 30, 1997 and entitled "METHODS AND COMPOSITIONS FOR IONIZING RADIATION SHIELDING," which is a continuation-in-part patent application of Ser. No. 08/221,506, filed Apr. 1, 1994, and entitled "RADIATION SHIELDING OF INTEGRATED CIRCUITS AND MULTI-CHIP MODULES IN CERAMIC AND METAL PACKAGES," now abandoned, which applications are incorporated herein by reference.

TECHNICAL FIELD

The present invention relates in general to a radiation shielding coating composition and a method of making and using it. The invention more particularly relates to compositions and methods for shielding microelectronic devices and other objects and animals, with a radiation-hardened light weight coating for withstanding the radiation hazards found in the space environment, as well as other less hazardous environments.

BACKGROUND ART

Many of today's commercial integrated circuit (IC) devices and multi-chip modules (MCM) cannot be utilized in deep space and earth orbiting applications because of total dose radiation induced damage. Commercial IC devices are developed and manufactured for computer and mass market applications and are not designed to withstand the effects of the natural space environment. The radiation effects include solar flares, galactic cosmic radiation and the Van Allen trapped electron and proton belts or man-made radiation induced events (neutrons and gamma radiation).

Typical commercial silicon integrated circuits fail to operate when exposed to total doses of two to fifteen kilorads(Si). Common methods used to prevent radiation degradation in performance are: 1) to design special radiation tolerant die, 2) to shield the entire component and board assembly, or 3) shield the individual component. There are weight, cost and time-to-market penalties depending on the method. For example, specially designed radiation tolerant die are time consuming and expensive to produce, since the part must be redesigned to incorporate radiation hardening techniques. Examples of such methods include U.S. Pat. Nos. 3,933,530; 4,014,772; 4,148,049; 4,313,7684; 4,402,002; 4,675,978; 4,825,278; 4,833,334; 4,903,108; 5,001,528; 5,006,479; 5,024,965; 5,140,390; 5,220,192; and 5,324,952, each of which patent is incorporated herein by reference. Reference may also be made to Japan patent 62-125651, Jun. 6, 1987, and articles entitled "Effects of Material and/or Structure on Shielding of Electronic Devices," R. Mangeret, T. Carriere, J. Beacour, T. M. Jordan, IEEE 1996; and "Novice, a Radiation Transport/Shielding Code", T. M. Jordan, E. M. P. Consultants Report, January 1960, the Japan patent and such articles being incorporated herein by reference.

Such techniques delay the time to market the products. As a result, these conventional radiation hardened devices are usually two to three generations behind the current commercial technological advances in both size and capabilities. There are additional penalties in limited marketability and demand, and hence low volume productions of the die result. Consequently, such methods produce a more expensive product, which is technologically behind the commercially available microelectronics, with slower speed and less capability. Additionally, because of the limited market for these products, they are frequently not available at all.

Such radiation shielding methods involve using metal shielding external to the package. Shielding by other mechanical or electrical elements complicates the platform design, often requiring complex three dimensional modeling of the design.

Another attempt at shielding includes disposing a small shield on the surface of the package. Such a technique does not provide effective three-dimensional shielding protection. Additionally, the small external shield is generally thermally mismatched to the package, and increases the size and weight of the package.

Examples of system level shielding are disclosed in U.S. Pat. Nos. 4,833,334 and 5,324,952, which are incorporated by reference as if fully set forth herein. The U.S. Pat. No. 4,833,334 discloses the use of a protective box to house sensitive electronic components. The box is partially composed of a high atomic weight material to shield effectively against x-rays. However this approach has the serious disadvantage of adding substantial bulk and weight to electronic circuit assemblies protected in this manner. Moreover, it would be expensive to provide this type of protection to individual integrated circuits as manufacturing custom boxes for each circuit configuration would be costly.

The method of shielding material on the outside of the package is known as spot shielding. Such a technique is disclosed in Japanese patent publication 62-125651, published Jun. 6, 1987, which is incorporated by reference as if fully set forth herein. This patent describes a spot shielded semiconductor device which utilizes a double layered shield film to serve as a sealing cover on an upper surface of a semiconductor package. Another double layered shield film is attached to a lower surface of the package. However, space qualified microelectronic parts must be capable of withstanding the enormous forces exerted during acceleration periods during space travel. The external shields are subject to tearing or prying off from the sealing cover. The use of a double layer shield film only slightly reduces the weight of the package, but increases the size of the package unnecessarily. Also, thin films are generally only effective at shielding electromagnetic interference (EMI) radiation and are ineffective at shielding ionizing radiation found in space. Examples of this type of EMI or EMF shielding devices include devices disclosed in U.S. Pat. Nos. 4,266,239; 4,823,523; and 4,868,716, which are incorporated herein by reference.

The significant disadvantage of the spot shielding method includes an increase in weight and thickness of the device, and an increase in exposure of the semiconductor to side angle radiation due to the shielding being spaced apart from the semiconductor.

Many conventional microcircuits are only available in prepackaged form, or the die is already mounted onto the circuit board. Therefore, it would be highly desirable to have technique and shielding compositions for shielding parts already packaged or mounted on a circuit board, or in bare IC die form. Such compositions should be relatively inexpensive to manufacture and use, and are compact in size. In this regard, such new and improved techniques should be very convenient to employ in a highly effective manner, and yet be relatively inexpensive to manufacture.

SUMMARY OF THE INVENTION

The principal object of the present invention is to provide a new and improved composition and method of radiation shielding in outer space or other environments, whereby such shielding compositions and methods are highly effective and relatively inexpensive.

Another object of the present invention is to provide such a new and improved method and composition, wherein the radiation tolerance of the bare die to be shielded is greatly improved, and the shielding is provided in all axial directions.

A further object of the present invention is to provide such a new and improved method and composition, wherein satellite designers can utilize current generation IC technological advances, while improving delivery time.

A still further object of the present invention is to provide such a new and improved method and composition, wherein IC devices can be supplied relatively inexpensively due to the use of commercially available dies at current market prices without undue weight, excessive or bulky sizes or other undesirable or unwanted design requirements.

Yet another object of the present invention is to provide such a new and improved composition and method of inventive radiation shielding for protecting other objects or animals from unwanted radiation.

Briefly, the above and further objects of the present invention are realized by providing shielding compositions and methods which are relatively inexpensive to use and highly effective in outer space and other environments.

The radiation shielding composition and method of the present invention relate to a conformal coating material composed of a matrix of densely packed radiation shielding particles, which are disbursed within a binder. The shielding composition is applied to objects to be protected such as integrated circuits, or to packages therefor, as well as for protecting animals including humans from unwanted exposure to radiation in outer space or other environments.

The inventive radiation shielding composition including the densely filled conformal coating material is used for commercially available integrated circuits or grouping of circuits, to protect against natural and man-made radiation hazards of the spacecraft environment, whether in earth orbit, geostationary, or deep space probes. The inventive composition and methods are provided to facilitate the design and manufacture of microelectronics, and to coat externally the microelectronics with the inventive shielding composition to improve radiation tolerance to natural space radiation.

The inventive shielding composition, in one form of the invention, includes a fabric and a flexible binder, used to shield animals including humans in space or in other environments. As humans prolong their stay in space, the risks from increased exposure to ionizing radiation become more of a concern. The conventional method of shielding using lead has two major disadvantages. Lead is highly toxic, which is a disadvantage in both manufacture and use. Lead is also relatively less dense. With the inventive composition, the same equivalent shielding can be obtained with a thinner high Z material such as tungsten. By using a denser material, a thinner shield can be constructed, making movement relatively easier. Since sources of radiation are not limited to space, this same material has utility to shield humans or other animals from radiation sources on earth.

The limiting factor is weight, and the energy and species of radiation. Thin densely packed shields are not very effective on high energy electromagnetic radiation such as gamma rays, and high energy neutrons.

Additionally, the inventive conformal coating composition and method are useful as a radiation shielding gasket between enclosures. There are many radiation shielding utilities for the inventive compositions and methods, depending on the choice of the binder material.

The present inventive methods and compositions contemplate using both plastic or ceramic packaged microelectronic devices, as well as unpackaged die and encapsulating or coating the outer surface of the device to provide shielding as required for the anticipated radiation environment. Since fluences of species and energy ranges of radiation vary in space, and since the optimal shielding varies depending on the species of radiation, the coating substance or material can be optimally tailored based on the anticipated radiation that irradiates the part to be protected. In all applications, the particles impregnated within the conformal coating substance are designed to achieve the highest tap density possible for the application.

The present inventive method preferably includes calculating/modeling the anticipated radiation spectrum, the required amount of shielding, as well as multiple layers of both high Z and low Z shielding material. The inventive conformal coating substance or material is then designed to meet that requirement. For a standard Geosynchronous Orbit, the optimum shielding entails a conformal coating having three layers; namely, a high Z layer sandwiched between two low Z layers. For marking and hermiticity, a layer of smooth unimpregnated coating material is applied to the top layer.

For integrated circuit devices that have already been packaged, the inventive conformal coating material can be applied in various manners. These include, but are not restricted to, the following inventive methods. One method relates to using a low pressure (or high pressure depending on the package strength and susceptibility) injection mold. The coating material is injected into a mold containing the packaged part. Another method involves "globbing" or putting a viscous conformal coating over a packaged part. The part can be disposed within a mold, or elsewhere when the shielding composition is applied. Another method involves spraying or painting on the coating composition. The optimum method is to coat all sides of the part uniformly with the shielding composition to shield all sides equally from isotropic radiation, and especially when the direction of the source of radiation is not known.

For integrated circuits already attached to a board, either in a bare die form or with an existing coating, the coating is applied with a mold, by "globbing" the composition on, by spraying or painting. To shield the top and bottom sides of the die uniformly, the bottom of the board preferably is also shielded with the inventive conformal shielding composition.

For multi-chip modules (MCMs) where there are multiple integrated circuits within a single package, the inventive conformal coating composition is applied in a similar manner as in the monolithic packaged integrated circuit. Similarly, when there are multiple bare integrated circuits, the inventive conformal coating composition is applied in a similar manner as with the single bare integrated circuit, wherein the coating composition is applied to the entire area covered by the devices to be shielded.

For system or boxes containing board level products requiring additional shielding, the inventive conformal coating composition can also be applied to any box or device to be shielded from ionizing radiation. In this manner, with the use of a flexible binder material such as latex, a gasket can be made for sealing two objects, wherein the inventive gasket material also provides a radiation shielding function.

Because of the flexibility of the inventive shielding composition, radiation shielding can be achieved easily and relatively inexpensively for applications that were either previously considered to be excessively expensive or difficult to shield.

For human radiation protection, the inventive composition conformal coating include a latex or similar flexible binder. To enhance the mechanical strength properties, a fabric material is added and combined with the binder. In this form of the invention, a high Z material, which is dense and nontoxic, can be inserted within the layers of clothing material to add extra protection for the wearer from unwanted radiation. Because of weight considerations, the optimal shielding can be obtained in the weightless environment of space. Lighter, thinner material is used for gravity constrained environments. Additionally, the impregnating particles can be tailored for the type of radiation to be encountered, enabling optimal use of space and weight of the material.

BRIEF DESCRIPTION OF DRAWINGS

The above mentioned and other objects and features of this invention and the manner of attaining them will become apparent, and the invention itself will be best understood by reference to the following description of the embodiment of the invention in conjunction with the accompanying drawings, wherein.

BEST MODE FOR CARRYING OUT THE INVENTION

The following description is of the best mode presently contemplated for practicing the invention. This description is not to be taken in a limiting sense, but is made merely for the purpose of describing the general principles of the invention. The scope of the invention should be ascertained with reference to the issued claims. In the description that follows, like numerals or reference characters will be used to refer to like parts or elements throughout.

Figure 1:
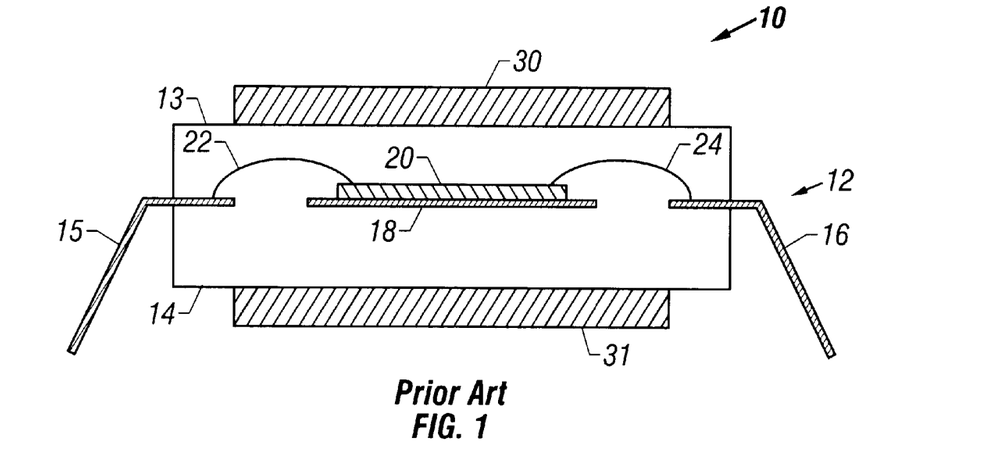
FIG. 1 is a diagrammatic sectional side view of a prior art spot shielded prepackaged integrated circuit.
Figure 2A:
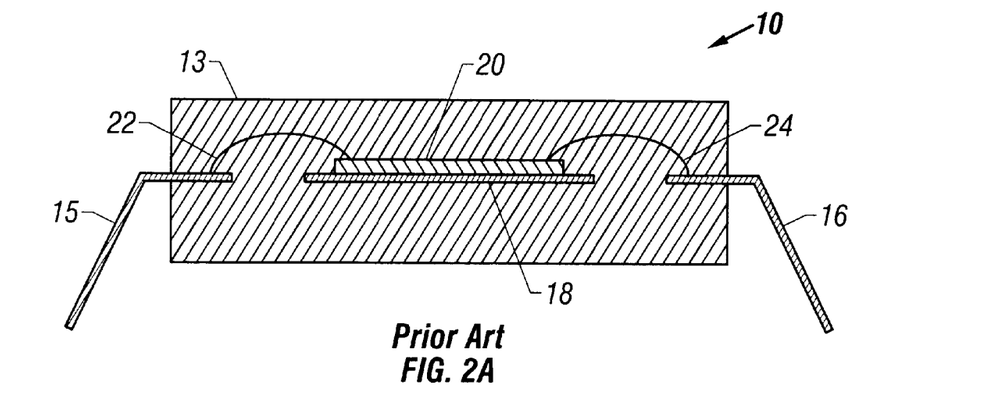
FIG. 2A is a diagrammatic sectional side view of a conventional unshielded commercial package assembly.
Figure 2B:
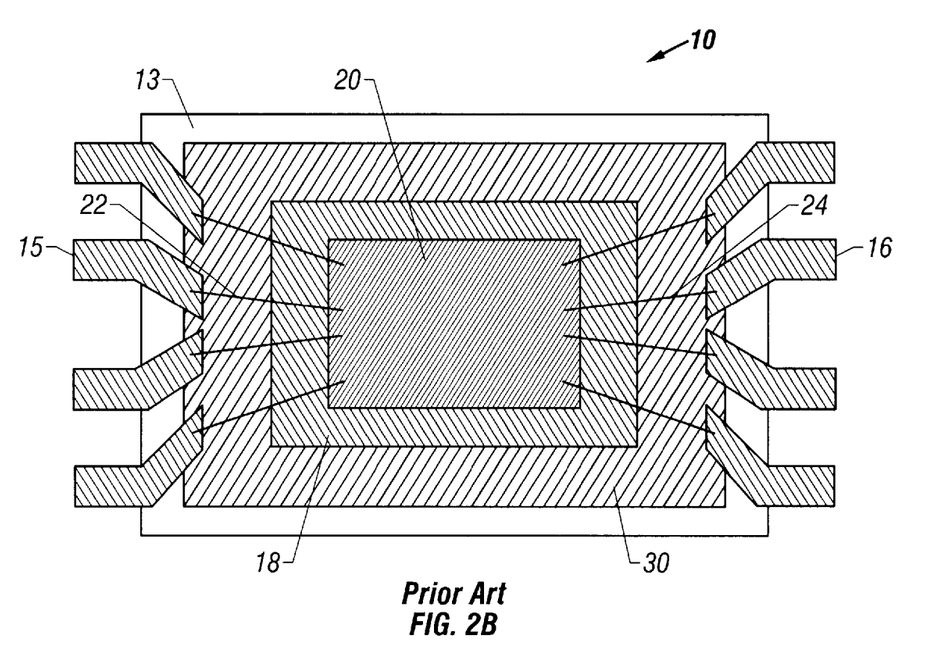
FIG. 2B is a diagrammatic top view of the package assembly of FIG. 2A.

Referring now to the drawings, and more particularly to FIGS. 1, 2A and 2B, there is shown a commonly used conventional microelectronic package 10, which is a plastic package. FIG. 1 illustrates the package 10 with a spot shield attached. The packages are comprised of a die 20, which is composed of silicon or other semiconductor base. The die is generally attached to a die attach pad 18 for support. The die is then bonded with multiple lead wires 22, 24 to a lead frame with multiple leads 15, 16. This entire assembly is encased within a package 13 composed of suitable plastic material or other material such as ceramic.

Figure 3:
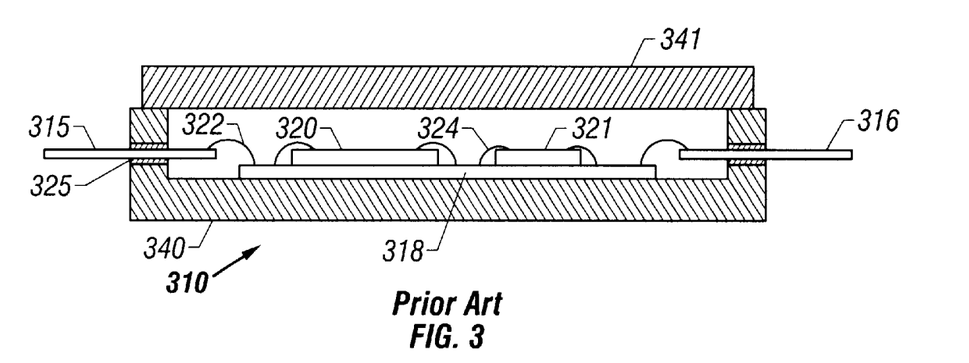
FIG. 3 is a diagrammatic sectional side view of a prior art module with multiple integrated circuit devices shielded therewithin.

If thermal conductivity properties are important considerations, other materials such as ceramics are used, as shown in FIG. 3, these are more difficult to work with and can be conducting, necessitating an insulating feed through 325 to cover the leads 15, 16.

A conventional method for shielding these packages is shown in FIG. 1, where a pair of shielding plates 30 and 31, usually made of a high Z material such as tantalum, is attached to the top and bottom portions of the package 13 respectively by a suitable adhesive (not shown).

As shown in FIG. 3, another prior art technique relates to the use of integrated shielding technology, where the package itself, is part of the shielding. FIG. 3 shows the integrated shielding package 310 that also incorporates multiple die 320 and 321. The multiple die 320 and 321 on a die attach pad 318 employ multiple lead wires 322 and 324, together with a lead frame with multiple leads 315 and 316 and an insulating feed through 325, for a package 310. This type of package is called an MCM or Hybrid package. With multiple die within the package, the density of functions increases, while the overall weight required to accomplish the task is reduced. This type of packaging requires base members 340 and 341, which can be made of various shielding materials. For ionizing radiation, high Z materials can be used, enabling the package itself to become the radiation shielding.

Figure 4:
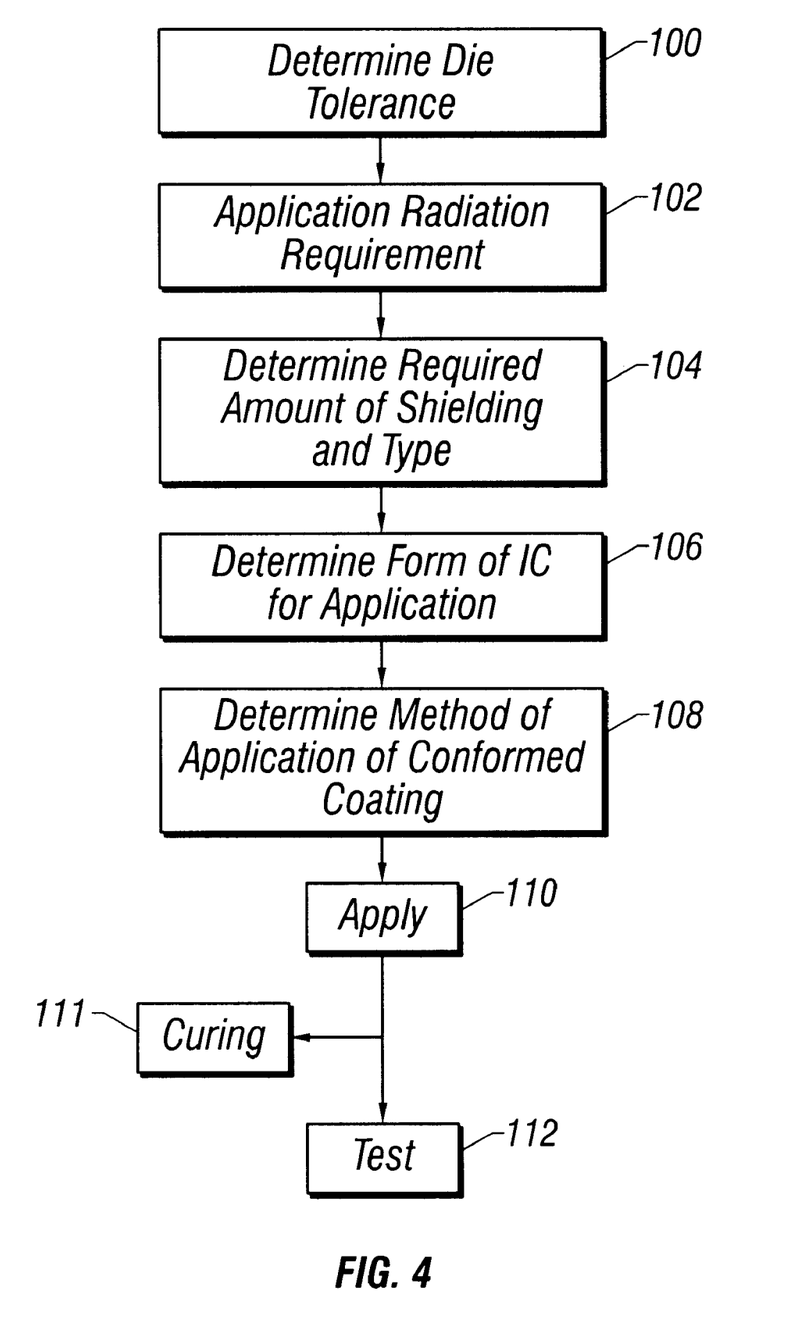
FIG. 4 is a flow chart illustrating a radiation shielding method according to the present invention.

As shown in FIG. 4, the inventive method includes, as indicated in box 100, determining the inherent radiation tolerance of the die to be shielded. This test can be accomplished by a Cobalt-60 source or other penetrating irradiation source. Without the knowledge of what the inherent radiation tolerance is for the individual semiconductor device, the designer does not know how much or whether shielding is necessary.

Figure 5:
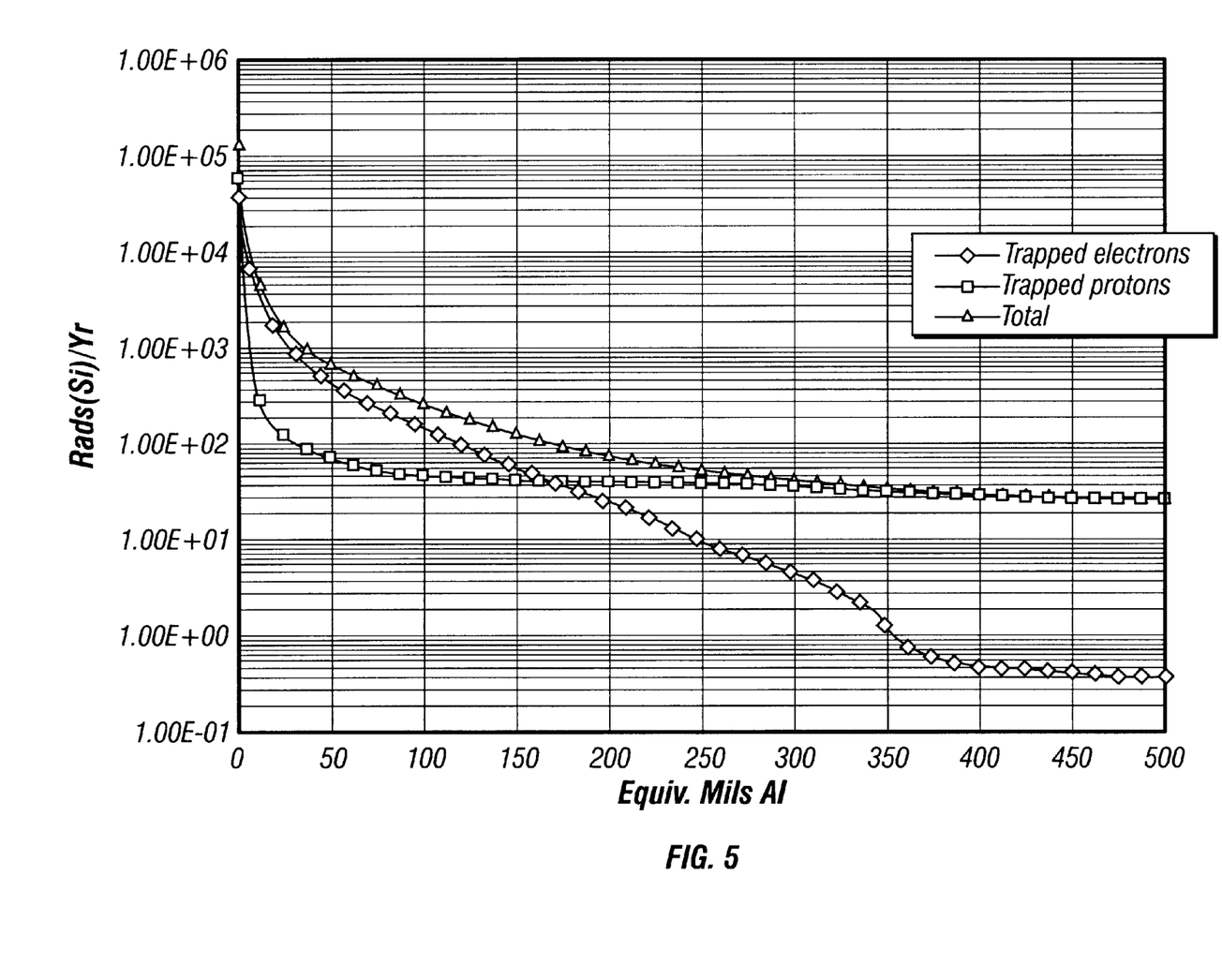
FIG. 5 is a graph of a typical total dose versus depth curve, useful in understanding the present invention.

The next step as indicated at 102 involves determining the radiation spectrum and dose depth curve of the particular mission or radiation requirement of the application. For orbits around the earth, this is calculated using conventional radiation transport codes in conjunction with conventional radiation spectrum tables. The dose depth curve is generally represented as a total radiation dose versus thickness of equivalent aluminum shielding as shown in FIG. 5. Although not preferred, steps indicated at 100 and 102 can be omitted if the application is unknown and the designer desires only to enhance whatever the radiation tolerance of the integrated circuit to be protected.

Knowing the inherent radiation tolerance of the integrated circuit device, as indicated at 100 and the dose depth curve as indicated at 102, the amount of shielding required can be determined to bring the integrated circuit device within tolerance as indicated at 104.

Knowing the spectrum of radiation for the application, the layering of the inventive shielding material is tailored as hereinafter described in greater detail with reference to FIG. 8. High Z material is more effective at stopping electrons and Bremsstrahlung radiation, and less effective in stopping protons. Low Z material conversely is more effective at stopping protons and less effective at stopping electrons and Bremsstrahlung radiation.

The next step, as indicated at 106, requires determining the form of the integrated circuit. For a prepackaged part, the amount of shielding is limited by the lead length on the bottom of the device, unless extenders are used. The most appropriate method of application of the inventive shielding composition is then determined as indicated at 108. The part is coated in a mold (not shown), using a dam. (not shown), and the coating can be globbed, sprayed, injected or painted on. For die that are already mounted on the board (not shown), the methods mentioned above are effective, but to insure uniform radiation shielding, the bottom of the board underneath the part is also coated with the same thickness of the inventive shielding composition. The coating material is applied as indicated at 110 and then allowed to cure as indicated at 111. Temporary extenders are preferably used to provide thorough wetting throughout the binder. As an example, a preferred extender for epoxy is a high boiling point ketone.

Additionally, by adjusting the properties of the binder, the bulk electrical properties of the shield composition is adjusted to be either insulating or conductive.

Upon completion of coating the parts, testing is then performed electrically and mechanically, as indicated generally at 112. For space applications, the parts require space qualification testing.

There are various different methods of application of the inventive shielding composition as contemplated by the invention and as indicated in FIGS. 5, 6, 7 and 8. However, the following examples are intended to be representative and not all inclusive of the possible application methods falling within the scope of the present invention.

Figure 6:
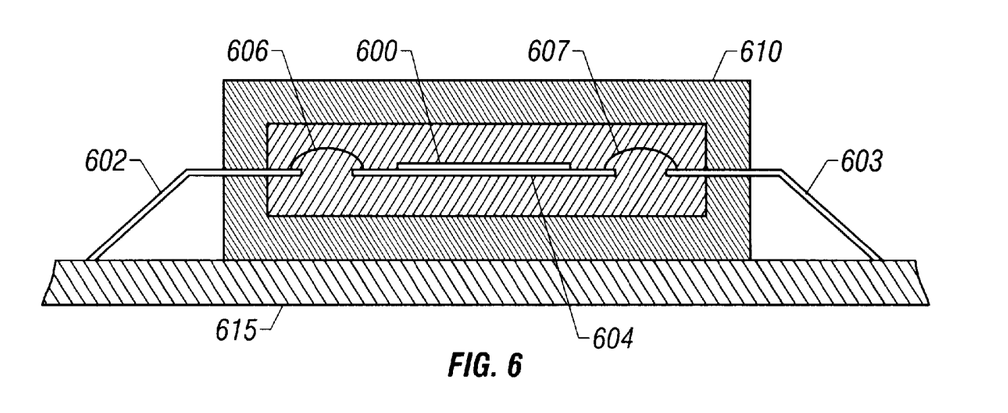
FIG. 6 is a diagrammatic sectional side view of a shielding composition applied to a conventional package in accordance with the present invention.

Referring now to FIG. 6, a coating method of the present invention is illustrated for a die 600 attached to a substrate 604. It should be understood that a multiple die device, such as the one shown in FIG. 3, may also be protected as will become apparent to those skilled in the art.

The die is wire bonded at 606 and at 607 to lead frame devices 602 and 603, respectively, to complete electrical connections between the die and systems (not shown) outside of the package. A radiation shielding conformal coating. composition is applied to the outside of the package 610. The package can then be applied to a board 615 or any other attachment system by any suitable conventional technique.

The radiation shielding conformal coating composition 610 is applied uniformly on the outer surface of the package to insure uniform radiation protection in accordance with the present invention. The coating can be applied by injection molding, mold casting, spraying, globbing or brushing the material onto the part to be protected.

Figure 7:
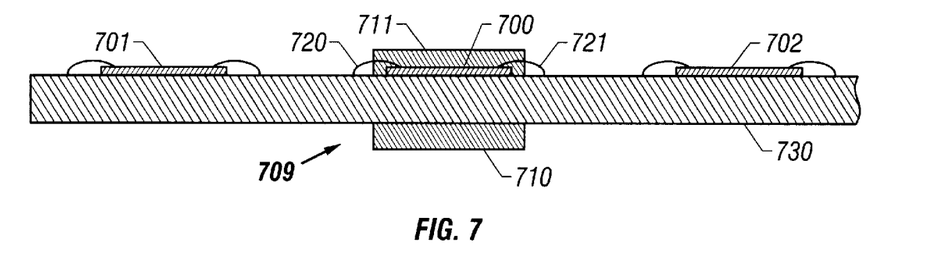
FIG. 7 is a diagrammatic sectional side view of a shielding composition applied to a conventional chip-on board in accordance with the present invention.

Referring now to FIG. 7, another method of application according to the invention includes applying the radiation shielding conformal coating composition generally indicated at 709 to an integrated circuit device 700 previously attached to a board 730. The board 730 may have other devices such as a pair of devices 701 and 702 not requiring protection. The device 700 is attached to the board via wire bonds 720 and 721. The radiation shielding conformal coating composition 709 is then applied both on top of the device 700 at 711 and directly underneath the device 700 at 710 on the board 730.

An area greater than the size of the device 700 is covered with radiation shielding conformal coating composition 710 on the bottom of the board 730. This is required to insure that the entire integrated circuit device is protected from radiation.

The radiation shielding conformal coating composition is applied by the same method as described in connection with the inventive method of FIG. 6.

Figure 8:
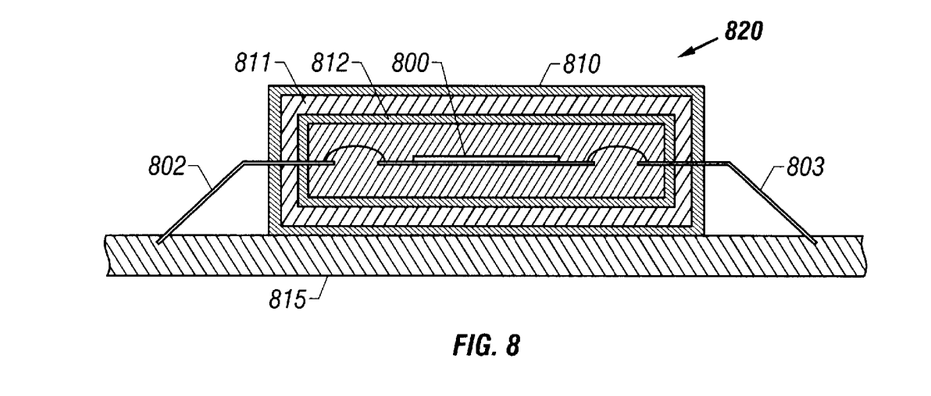
FIG. 8 is a diagrammatic sectional side view of a multilayered conformal coating of shielding composition applied to a conventional integrated circuit package in accordance with the present invention.

Referring now to FIG. 8, to enhance radiation shielding performance, multiple layers of the inventive radiation shielding conformal coating composition are applied. Using conventional codes such as NOVICE, different shielding layering are developed for each type of orbit. An optimum shielding geometry for a Geosynchronous Orbit is shown in FIG. 8.

As shown in FIG. 8, in accordance with the present invention, a die 800 having an integrated circuit package 804 containing lead frame devices 802 and 803 is encased within a multiple layer radiation shielding composition generally indicated at 820, prior to mounting the shielded die to a board or substrate 815. The multiple layer shielding composition 820 comprises a layer of high Z particles 811 interposed between a pair of outer and inner layers of low Z particles 810 and 812. The low Z layer 812 is applied directly to the outer surface of the die 800 in accordance with the method described in connection with FIG. 6. Thereafter, the intermediate high Z layer 811 is then applied to the outer surface of the inner low Z layer 812.

The outer low Z layer 810 is then applied to the outer surface of the intermediate high Z layer 811 to complete the shielding protection for the die 800. The shielded die 800 is then connected electrically and mounted to the board 815 by conventional techniques.

The high Z material is effective in stopping electrons and Bremsstrahlung radiation, while the low Z material is more effective in stopping protons. A Geosynchronous orbit is dominated by trapped electrons, so it is preferable that the intermediate high Z layer 811, is thicker than the other two low Z layers. It will become apparent to those skilled in the art that the multiple layer coating method of the present invention can be used in connection with the protection of many different types and kinds of integrated circuit devices and the like. Additionally, the coating method can be applied by any method including, but not limited to, those described in connection with the method of FIG. 6.

Figure 9:
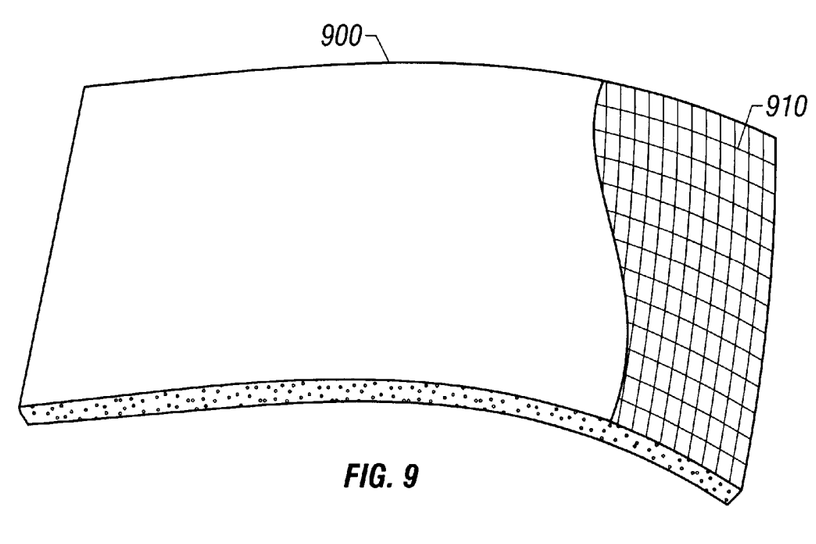
FIG. 9 is a pictorial, partially diagrammatic fragmentary view of a shielding composition used for animal radiation shielding in accordance with the present invention.

Referring to FIG. 9, there is shown a flexible shielding material, which is composed according to the present invention. The material 900 contains the inventive radiation shielding composition, and is flexible and pliable to serve as clothing for humans or gasket material for parts (not shown). The conformal coating material 900 includes a flexible binder such as latex. The material 900 is impregnated with a fabric such as a cloth woven material 910 for strength. The cloth material can be composed of conventional materials such as cotton or polyester. For extra strength, nonwoven fabric such as Kevlar or Teflon material can be used for the fabric.

Considering now the inventive radiation shielding composition forming a part of the foregoing inventive methods and materials, the following examples of shielding compositions are given to aid in understanding the invention, but it is to be understood that the particular procedures, conditions and materials of these examples are not intended as limitations of the present invention.

EXAMPLE I

| 10.0 parts by weight | high tap density tungsten powder |
|---|---|
| 0.15 part by weight | premixed epoxy |
| up to 0.50 part by weight | ketone |

The tungsten powder serves as a high Z material for radiation shielding purposes. The epoxy serves as a binder to help adhere the composition to a surface, and the ketone is added as an extender.

To formulate the inventive composition, the ingredients of Example I are mixed thoroughly, and then the mixture is applied to a part. The applied mixture is in the form of a paste, and is heated slowly at a suitable low temperature such as 40° C. for about one hour to remove a substantial portion of the ketone extender without disrupting the integrity of the packed tungsten powder. The mixture is then heated at about 60° C. for about 16 hours to retain the stability of the composition. The temperature is then increased to about 150° C. for an additional period of time of about 0.5 hours. The resulting mixture has the desired consistency of a paste, and retains its stability due to the foregoing multiple heating phases.

EXAMPLE II

In general, the ingredients of the present Example can be adjusted to accommodate variations in the foregoing described inventive methods and applications.

The shielding powder can be any suitable high Z radiation shielding powder such as osmium, iridium, platinum, tantalum and gold. In general, any high Z material may be employed having an atomic number of 50 and above. More preferably, the range of atomic numbers can be between 60 and 100, inclusive. The most preferred range of atomic numbers is between 73 and 79, inclusive.

The shielding powder can also be a low Z material, such as the one mentioned in connection with the description of the inventive method of FIG. 8. The low Z shielding powder is preferably selected from the group consisting of copper, nickel, carbon, titanium, chromium, cobalt, boron, silicon, iron and nitrogen. In general, any suitable low Z material may be employed having an atomic number of 30 and below, but the most preferred group of low Z materials is selected from the group consisting of copper, nickel, carbon, iron, titanium, silicon and nitrogen.

In general, the shielding powder can be any suitable material composed of a matrix of densely packed shielding particles. The preferred material is tungsten (Example 1) having a packing density of at least 150 grn per cubic inch.

There can be between about 0.10 and about 0.50 parts by weight of a binder in the form of a suitable resin. The binder can be a urethane. The exact quantity of the binder determines the final density and strength of the shielding afforded by the inventive composition. A more preferred range of the binder is between about 0.13 and about 0.30.

Also, in general, the extender assures complete wetting of the powders and adjusts the viscosity of the paste to suit the application method.

EXAMPLE III

| 10.0 parts by weight | high tap density tungsten powder |
|---|---|
| 0.15 part by weight | premixed epoxy |
| up to 0.50 part by weight | latex |

This example of the inventive material may be used for the method described in connection with FIG. 9, wherein a fabric may be embedded therein for reinforcing purposes. Any suitable elastomer may be employed for the latex.

While particular embodiments of the present invention have been disclosed, it is to be understood that various different modifications are possible and are contemplated within the true spirit and scope of the appended claims. There is no intention, therefore, of limitations to the exact abstract or disclosure herein presented.

What is claimed is:

1. A method for making a shielding composition comprising:
   mixing an ionizing radiation shielding powder, a binder, and an extender to create a coating composition;
   heating the coating composition at a temperature;
   increasing the temperature to eliminate the extender and create a paste;
   wherein said ionizing radiation shielding powder is at a concentration sufficient to shield a target from ionizing radiation;
   determining a thickness of said paste sufficient to shield an integrated circuit device from receiving an amount of radiation greater than a total dose tolerance of the integrated circuit device; and
   applying said paste to the integrated circuit device.

2. A method according to claim 1, wherein said mixing comprises mixing a high Z ionizing radiation shielding powder to create said coating composition.

3. A method according to claim 1, wherein said mixing comprises mixing a low Z ionizing radiation shielding powder to create said coating composition.

4. A method according to claim 2, wherein said mixing comprises mixing said high Z ionizing radiation shielding powder selected from the group consisting of tungsten, osmium, iridium, platinum, tantalum and gold to create said coating composition.

5. A method according to claim 3, wherein said mixing comprises mixing said low Z ionizing radiation shielding powder selected from the group consisting of copper, nickel, carbon, titanium, chromium, cobalt, boron, silicon, iron and nitrogen to create said coating composition.

6. A method according to claim 2, wherein said mixing comprises mixing said high Z ionizing radiation shielding powder having an atomic number of 50 and above to create said coating composition.

7. A method according to claim 6, wherein said mixing comprises mixing said high Z ionizing radiation shielding powder having an atomic number between 60 and 100 to create said coating composition.

8. A method according to claim 7, wherein said mixing comprises mixing said high Z ionizing radiation shielding powder having an atomic number between 73 and 79 to create said coating composition.

9. A method according to claim 3, wherein said mixing comprises mixing said low Z ionizing radiation shielding powder having an atomic number of 30 and below to create said coating composition.

10. A method according to claim 1, wherein said mixing comprises mixing said ionizing radiation shielding powder of 10 parts by weight, said binder of between 0.10 parts by weight and 0.50 parts by weight, and said extender of up to 0.50 parts by weight to create said coating composition.

11. A method according to claim 1, wherein said mixing comprises mixing said ionizing radiation shielding powder, an epoxy, and said extender to create said coating composition.

12. A method according to claim 1, wherein said mixing comprises mixing said ionizing radiation shielding powder, said binder, and ketone to create said coating composition.

13. A method according to claim 1, wherein said heating comprises heating said coating composition at a temperature of about 60 degrees Celsius for about 16 hours; and said increasing comprises increasing said temperature to about 150 degrees Celsius for about 0.5 hours to eliminate said extender and create said paste.

14. A method according to claim 1, wherein said mixing comprises mixing said ionizing radiation shielding powder, said binder, and an elastomer to create said coating composition.

15. A method according to claim 14, wherein said mixing comprises mixing said ionizing radiation shielding powder, said binder, and latex to create said coating composition.

16. A method according to claim 14, further including impregnating said coating composition with a fabric.

17. A method according to claim 16, further including impregnating said coating composition with a fabric selected from the group consisting of cotton, polyester, Kevlar and Teflon.

18. A method according to claim 1, further including applying said paste to said integrated circuit device using a low pressure injection mold.

19. A method according to claim 1, further including applying said paste to said integrated circuit device inside a mold which encases said integrated circuit device.

20. A method according to claim 1, further including applying said paste on said integrated circuit device by spraying layers of said paste onto said integrated circuit device.

21. A method according to claim 1, further including globbing said paste onto said integrated circuit device.

22. A method according to claim 1, further including painting said paste onto said integrated circuit device.

23. A method for making a shielding composition comprising:

mixing a high Z ionizing radiation shielding powder, a binder, and an extender to create a coating composition;

heating the coating composition at a temperature;

increasing the temperature to eliminate the extender and create a paste;

wherein said ionizing radiation shielding powder is at a concentration sufficient to shield a target from ionizing radiation;

determining a thickness of said paste sufficient to shield an integrated circuit device from receiving an amount of radiation greater than a total dose tolerance of the integrated circuit device; and applying said paste to the integrated circuit device.

24. A method for making a shielding composition comprising:

mixing an ionizing radiation shielding powder, a binder, and an extender to create a coating composition;

heating the coating composition at a temperature;

increasing the temperature to eliminate the extender and create a paste;

determining a thickness of said paste sufficient to shield an integrated circuit device from receiving an amount of radiation greater than a total dose tolerance of the integrated circuit device; and applying said paste to the integrated circuit device;

wherein said ionizing radiation shielding powder is at a concentration sufficient to shield a target from ionizing radiation;

wherein said heating comprises heating said coating composition at a temperature of about 60 degrees Celsius for about 16 hours;

wherein said increasing comprises increasing said temperature to about 150 degrees Celsius for about 0.5 hours to eliminate said extender and create said paste.

* * * * *

UNITED STATES PATENT AND TRADEMARK OFFICE
CERTIFICATE OF CORRECTION

PATENT NO. : 6,261,508 B1 Page 1 of 1
APPLICATION NO. : 09/375881
DATED : July 17, 2001
INVENTOR(S) : Michael Featherby et al.

It is certified that error appears in the above-identified patent and that said Letters Patent is hereby corrected as shown below:

At column 1, line 23, please insert:

STATEMENT REGARDING FEDERALLY SPONSORED RESEARCH OR DEVELOPMENT

This invention was made with Government support under Contract NAS1-97008 awarded by NASA. The Government has certain rights in this invention.

Signed and Sealed this

Twenty-second Day of August, 2006

JON W. DUDAS
*Director of the United States Patent and Trademark Office*